United States Patent
Nakata

(10) Patent No.: US 9,437,725 B2
(45) Date of Patent: Sep. 6, 2016

(54) SEMICONDUCTOR DEVICE AND SEMICONDUCTOR SUBSTRATE

(71) Applicant: Sumitomo Electric Industries, Ltd., Osaka-shi, Osaka (JP)

(72) Inventor: Ken Nakata, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/540,545

(22) Filed: Nov. 13, 2014

(65) Prior Publication Data

US 2015/0129889 A1   May 14, 2015

(30) Foreign Application Priority Data

Nov. 13, 2013   (JP) ................. 2013-235399

(51) Int. Cl.
*H01L 29/778* (2006.01)
*H01L 29/20* (2006.01)
*H01L 29/201* (2006.01)
*H01L 29/205* (2006.01)
*H01L 27/06* (2006.01)

(52) U.S. Cl.
CPC ........ *H01L 29/7783* (2013.01); *H01L 29/7784* (2013.01); *H01L 29/7786* (2013.01); *H01L 27/0605* (2013.01); *H01L 29/201* (2013.01); *H01L 29/2003* (2013.01); *H01L 29/205* (2013.01)

(58) Field of Classification Search
CPC ........... H01L 29/7787; H01L 29/2003; H01L 29/201; H01L 29/205; H01L 29/1033; H01L 29/7784; H01L 29/66462; H01L 27/0605; H01L 29/20; H01L 29/7786
USPC ............. 257/76, 12, 17, 192, 194, 196, 197, 257/E29.246, E27.116; 438/172, 235, 309, 438/312
See application file for complete search history.

(56) References Cited

U.S. PATENT DOCUMENTS

| | | | | |
|---|---|---|---|---|
| 8,853,666 B2 * | 10/2014 | Inoue | ................. | H01L 29/155 257/12 |
| 2009/0045438 A1 * | 2/2009 | Inoue | ................. | H01L 29/155 257/192 |

FOREIGN PATENT DOCUMENTS

| | | |
|---|---|---|
| JP | 06-097204 | 4/1994 |
| JP | 2008-288474 | 11/2008 |

* cited by examiner

*Primary Examiner* — Thinh T Nguyen
(74) *Attorney, Agent, or Firm* — Smith, Gambrell & Russell, LLP.

(57) ABSTRACT

A semiconductor device is provided, which includes a barrier layer 14 formed on a substrate 10 and made of $In_xAl_yGa_{1-x-y}N$, a channel layer 16 formed on the barrier layer and made of GaN or InGaN, an electron supplying layer 18 formed on the channel layer and made of AlGaN, InAlN, or InAlGaN, and a gate electrode and ohmic electrodes 24 and 26 formed on the electron supplying layer. Relations between x and y for the barrier layer of $x>0$, $y>0$, $x+y \leq 1$, and $0.533x < y < 4.20x$ are satisfied.

17 Claims, 18 Drawing Sheets

(a)

(b)

(a)

(b)

SEMICONDUCTOR DEVICE AND SEMICONDUCTOR SUBSTRATE

TECHNICAL FIELD

The present invention relates to a semiconductor device and a semiconductor substrate, and relates, for example, to a semiconductor device and a semiconductor substrate, each including a channel layer made of GaN or InGaN.

BACKGROUND

A known type of semiconductor device based on nitride semiconductors is a high electron mobility transistor (HEMT) including a laminate of a buffer layer, a GaN (gallium nitride) channel layer, and an AlGaN (aluminum gallium nitride) electron supplying layer. A HEMT operates through the use of carriers of high concentration generated at the interface between a channel layer and an electron supplying layer.

Nitride semiconductors have higher breakdown voltages than GaAs (gallium arsenide) based semiconductors and are thus operable under high voltages. For example, HEMTs formed with nitride semiconductors have power densities ten times higher than HEMTs formed with GaAs semiconductors. Hence, nitride-semiconductor HEMTs are used in devices of high-power and high-frequency performance.

Patent Literature 1 describes a technique to use a double heterostructure of n-type AlGaAs (aluminum gallium arsenide) barrier layer/n-type InGaAs (indium gallium arsenide) channel layer/n-type AlGaAs layer for a HEMT in order to improve its distortion characteristic. Through this technique, the flatness of Gm can be improved. Thus, the distortion characteristic of HEMTs can be improved. Patent Literature 2 describes a double heterostructure for a nitride-semiconductor HEMT.

Patent Literature 1 Japanese Patent Application Laid-Open Publication No. H06-97204

Patent Literature 2: Japanese Patent Application Laid-Open Publication No. 2008-288474

SUMMARY

Improvement in distortion characteristic is, however, difficult to achieve for nitride-semiconductor HEMTs through double heterostructures as described in Patent Literature 2.

An object of the present invention, which has been achieved in light, for example, of the challenges described above is to improve the distortion characteristic of a nitride-semiconductor HEMT.

An aspect of the invention is a semiconductor device, including: a barrier layer formed on a substrate and made of one of InAlGaN and InAlN; a channel layer formed on the barrier layer and made of one of GaN and InGaN; an electron supplying layer formed on the channel layer and Made of one of AlGaN, InAlN and InAlGaN; and a gate electrode and ohmic electrodes formed on the electron supplying layer, wherein an interface between the barrier layer and the channel layer and an interface between the channel layer and the electron supplying layer have conduction hand enemy lower than the Fermi level energy.

In the arrangement described above, the channel layer may have a thickness of not less than 20 nm and not more than 100 nm.

In the arrangement described above, the barrier layer may be a single layer having uniform composition.

In the arrangement described above, the barrier layer may include a plurality of layers, each layer having uniform composition.

An aspect of the invention is a semiconductor device, including: a barrier layer formed on a substrate and made of $In_xAl_yGa_{1-x-y}N$; a channel layer formed on the barrier layer and made of one of GaN and InGaN; an electron supplying layer formed on the channel layer and made of one of AlGaN, InAlN, and InAlGaN; and a gate electrode and ohmic electrodes formed on the electron supplying layer, wherein relations between x and y for the barrier layer of $x>0$, $y>0$, $x+y \leq 1$, and $0.533x < y < 420x$ are satisfied.

In the arrangement described above, the barrier layer may have a band gap of not less than 3.6 eV.

In the arrangement described above, a relation of $2.10x < y$ may be satisfied.

In the arrangement described above, the channel layer may have a thickness of not less than 20 nm and not more than 100 nm.

In the arrangement described above, in a case in which the electron supplying layer is made of InAlN, the electron supplying layer may have less than 18% In.

In the arrangement described above, the barrier layer may be a single layer having uniform composition.

In the arrangement described above, the barrier layer may include a plurality of layers, each layer having uniform composition.

In the arrangement described above, in a case in which the electron supplying layer is made of AlGaN, the electron supplying layer may have 15-30% Al, in a case in which the electron supplying layer is made of InAlN, the electron supplying layer may have 83-85% Al, and in a case in which the electron supplying layer is made of InAlGaN, the electron supplying layer may have 65-85% Al and 0-20% Ga.

An aspect of the invention is a semiconductor substrate, including: a barrier layer formed on a substrate and made of $In_xAl_yGa_{1-x-y}N$; a channel layer formed on the barrier layer and made of one of GaN and InGaN; and an electron supplying layer formed on the channel layer and made of one of AlGaN, InAlN, and InAlGaN, wherein relations between x and y for the barrier layer of $x>0$, $y>0$, $x+y \leq 1$, and $0.533x < y < 410x$ are satisfied.

In the arrangement described above, the barrier layer may have a band gap of not less than 3.6 eV.

In the arrangement described above, a relation of $2.10x < y$ may be satisfied.

In the arrangement described above, the channel layer may have a thickness of not less than 20 nm and not more than 100 nm.

In the arrangement described above, in a case in which the electron supplying layer is made of InAlN, the electron supplying layer may have less than 18% In.

In the arrangement described above, in a case in which the electron supplying layer is made of AlGaN, the electron supplying layer may have 1.5-30% Al, in a case in which the electron supplying layer is made of MAIN, the electron supplying layer may have 83-85% Al, and in a case in which the electron supplying layer is made of InAlGaN, the electron supplying layer may have 65-85% Al and 0-20% Ga.

In the aspects of the invention, the distortion characteristic can be improved for, for example, a nitride-semiconductor HEMT.

DETAILED DESCRIPTION

Figure 1:
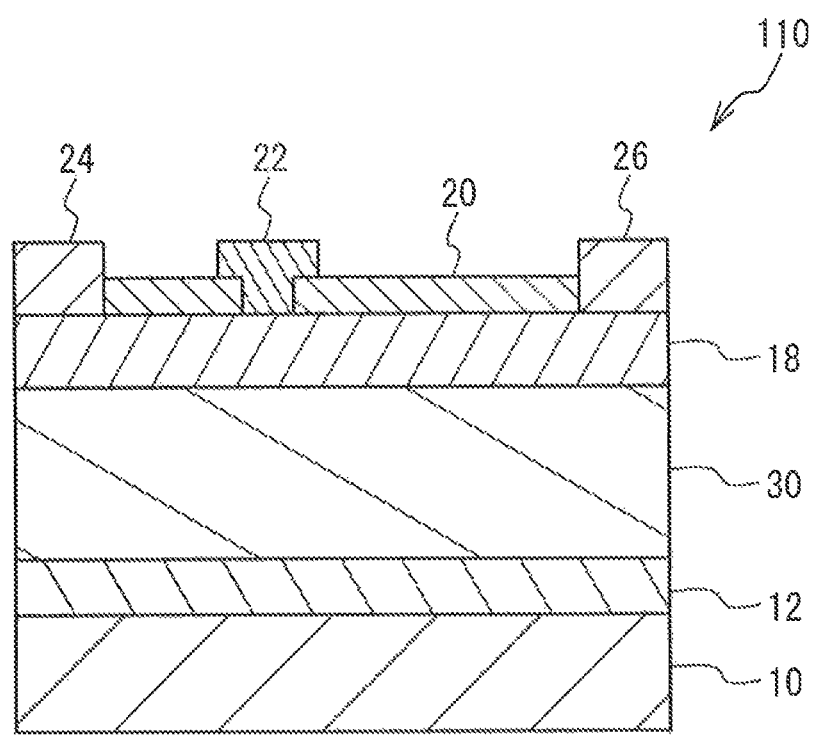
FIG. 1 is a sectional view of a semiconductor device according to Comparative Example 1.

FIG. 1 is a sectional view of a semiconductor device according to Comparative Example 1. With reference to FIG. 1, a semiconductor device 110 includes a substrate 10, on which an AlN buffer layer 12, a GaN channel layer 30, and an AlGaN electron supplying layer 18 are formed. An insulating film 20, a gate electrode 22, a source electrode 24, and a drain electrode 26 are formed on the AlGaN electron supplying layer 18.

Figure 2:
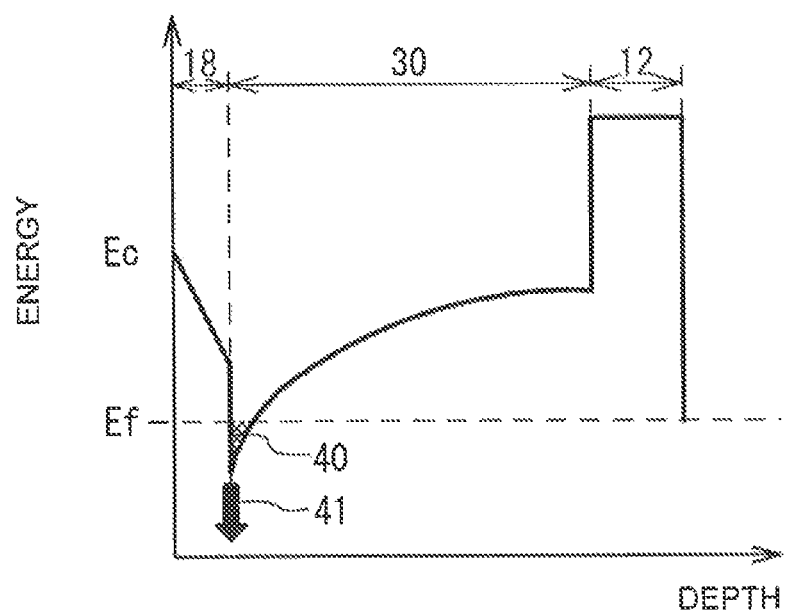
FIG. 2 is a graph of energy with respect to depth underneath a gate electrode of the semiconductor device according to Comparative Example 1.

FIG. 2 is a graph of energy with respect to depth underneath the gate electrode of the semiconductor device according to Comparative Example 1. With reference to FIG. 2, Ec represents the bottom of the conduction band (hereinafter simply referred to as the conduction band), and Ef represents the Fermi level. Positive piezoelectric charges are generated at the interface between the channel layer 30 and the electron supplying layer 18 due to difference in lattice constants of the channel layer 30 and the electron supplying layer 18. The conduction band Ec is lowered accordingly, as marked with an arrow 41. This creates a two-dimensional electron gas 40 in the conduction band Ec, which is lower than the Fermi level Ef.

Figure 3:
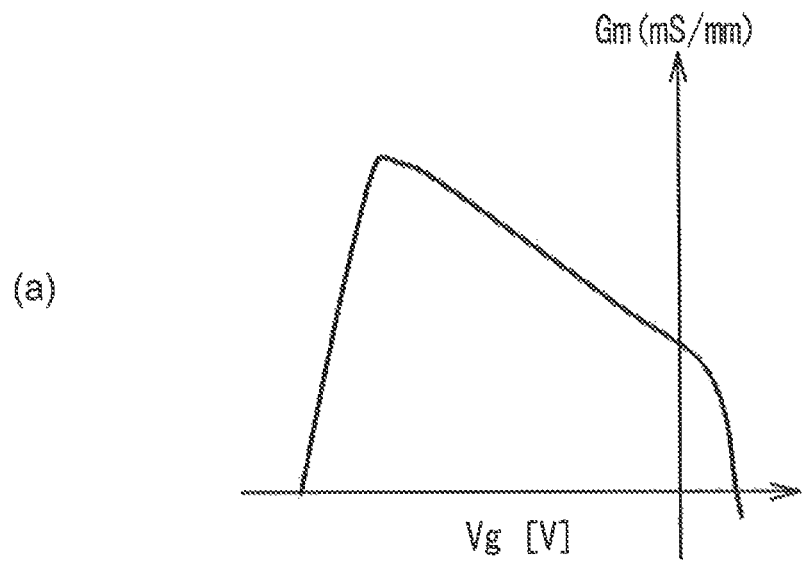
FIG. 3 includes (a) a diagrammatic representation of transconductance gm with respect to gate voltage Vg in Comparative Example 1 and (b) a diagrammatic representation of output power Pout and intermodulation distortion IM3 with respect to input power Pin in Comparative Example 1 used as a high-power amplifier.
Figure 3:
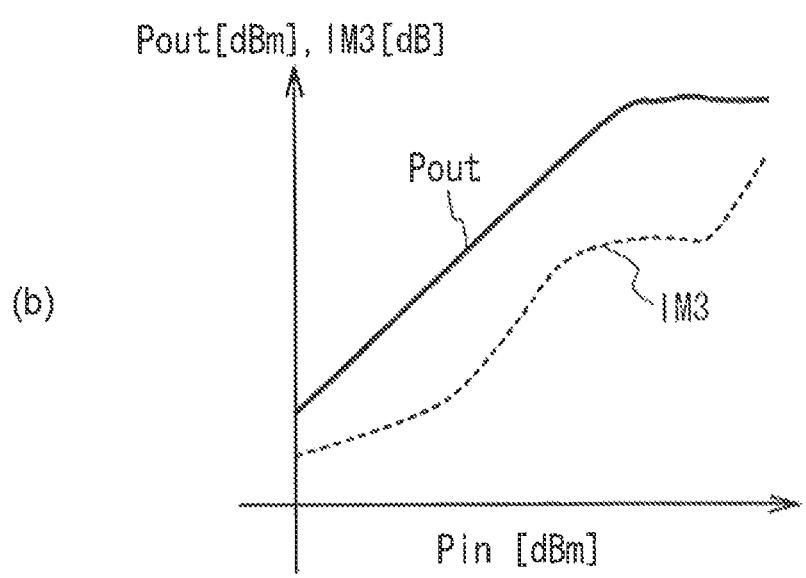

Part (a) of FIG. 3 is a diagrammatic representation of transconductance gm with respect to gate voltage Vg in Comparative Example 1, and Part (b) of FIG. 3 is a diagrammatic representation of output power Pout and intermodulation distortion IM3 with respect to input power Pin in Comparative Example 1 used as a high-power amplifier. Measuring conditions will be described hereinafter. As illustrated in Part (a) of FIG. 3, gm is peaked, having no flat region with respect to Vg. The distortion characteristic degrades with reduction of the flat region of gm. As illustrated in Part (b) of FIG. 3, the output power Pout increases with an increase in input power Pin. The output power Pout is saturated with further increase in input power Pin. The third-order intermodulation distortion IM3 increases with an increase in input power Pin. As described above, Comparative Example 1 exhibits increased intermodulation distortion IM3, with degraded distortion characteristic.

Figure 4:
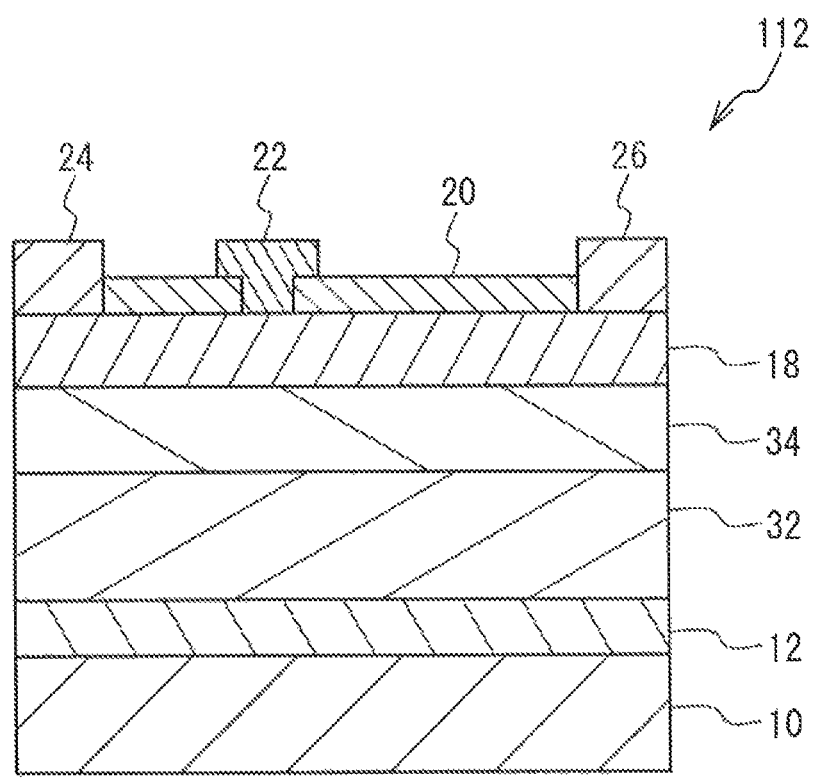
FIG. 4 is a sectional view of a semiconductor device according to Comparative Example 2.

FIG. 4 is a sectional view of a semiconductor device according to Comparative Example 2. With reference to FIG. 4, a semiconductor device 112 includes a substrate 10, on which an AlN buffer layer 12, an AlGaN barrier layer 32, a GaN channel layer 34, and an AlGaN electron supplying layer 18 are formed. An insulating film 20, a gate electrode 22, a source electrode 24, and a drain electrode 26 are formed on the AlGaN electron supplying layer 18. A double heterostructure of AlGaN barrier layer 32/GaN channel layer 34/AlGaN electron supplying layer 18 is provided in Comparative Example 2.

Figure 5:
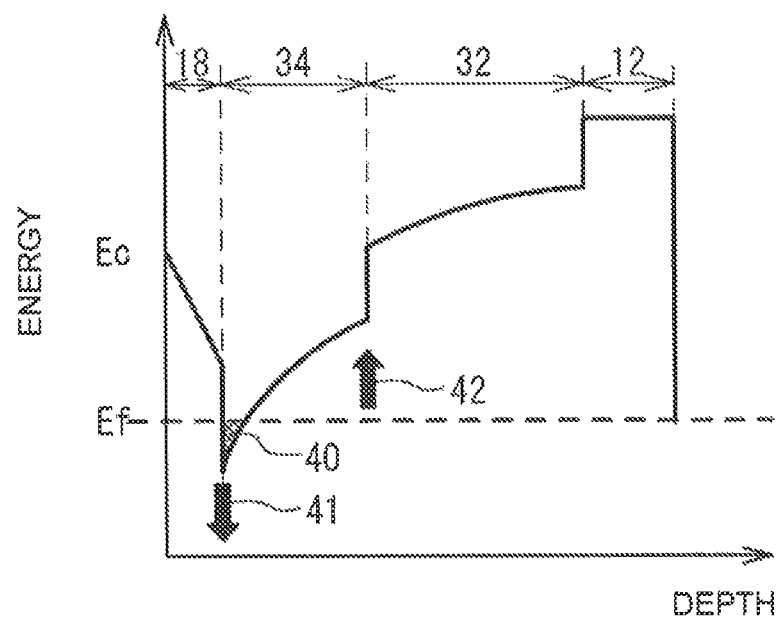
FIG. 5 is a graph of the energy with respect to the depth underneath a gate electrode of the semiconductor device according to Comparative Example 2.

FIG. 5 is a graph of the energy with respect to the depth underneath the gate electrode of the semiconductor device according to Comparative Example 2. As illustrated in FIG. 5, positive piezoelectric charges are generated at the interface between the channel layer 34 and the electron supplying layer 18, as in Comparative Example 1. Negative piezoelectric charges are generated at the interface between the barrier layer 32 and the channel layer 34. This is because the crystal orientation from the channel layer 34 to the barrier layer 32 is opposite to the crystal orientation from the channel layer 34 to the electron supplying layer 18. The conduction band Er at the interface between the barrier layer 32 and the channel layer 34 are raised accordingly, as marked with an arrow 42. This prevents the conduction band a at the channel layer 34 from taking a substantially inverted U shape (for example, the shape of the conduction band at the channel layer in FIG. 2 in Patent Literature 1). Thus, the distortion characteristic is not improved in Comparative Example 2.

First Embodiment

Figure 6:
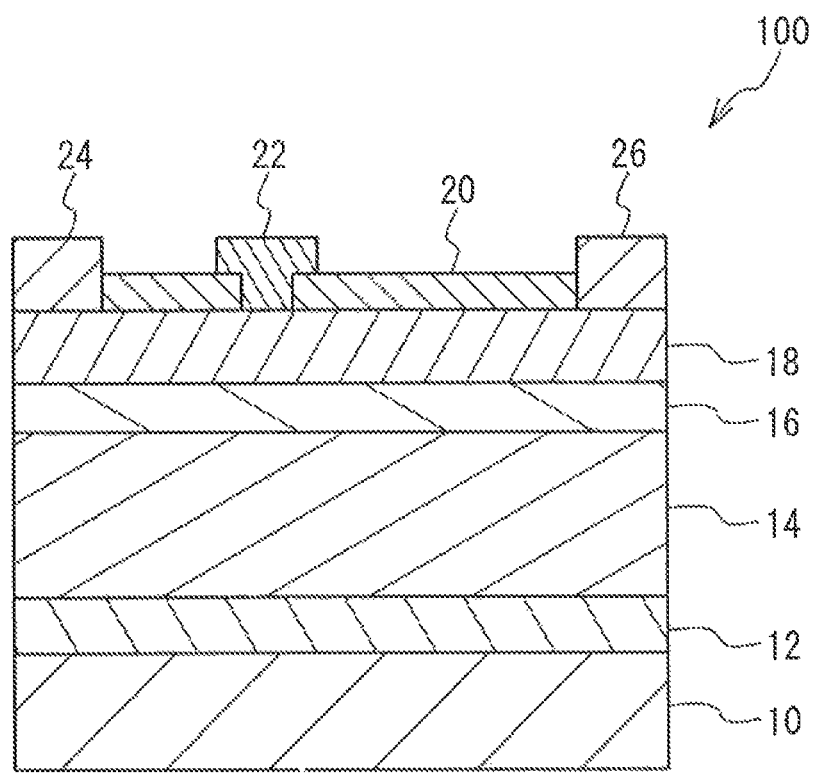
FIG. 6 is a sectional view of a semiconductor device according to a first embodiment.

FIG. 6 is a sectional view of a semiconductor device according to a first embodiment. With reference to FIG. 6, a semiconductor device 100 includes nitride semiconductor layers on a substrate 10. A buffer layer 12 is formed on the substrate 10. The substrate 10 is, for example, a SiC (silicon carbide) substrate, a Si (silicon) substrate, a GaN substrate, or a sapphire substrate, with the (0001) plane as the principal plane. The buffer layer 12, which is for forming high quality nitride semiconductor layers on the substrate 10, is made of AlN or AlGaN. A barrier layer 14 is formed on the buffer layer 12. The barrier layer 14 is made of InAlGaN (indium aluminum gallium nitride) or InAlN (indium aluminum nitride). A channel layer 16 is formed on the barrier layer 14. The barrier layer 14 and the channel layer 16 are in contact with each other. The channel layer 16 is made of GaN or InGaN (indium gallium nitride). An electron supplying layer 18 is formed on the channel layer 16. The electron supplying layer 18 is made of AlGaN, InAlN, or InAlGaN. The channel layer 16 and the electron supplying layer 18 are in contact with each other. A spacer layer may be formed between the channel layer 16 and the barrier layer 14. A cap layer (not shown) made of a nitride semiconductor may be formed on the electron supplying layer 18. In such a case, a gate electrode 22 may be formed on the cap layer, and a source electrode 24 and a drain electrode 26 may be formed on the electron supplying layer 18.

An insulating film 20 is formed on the electron supplying layer 18. The insulating film 20 is, for example, a silicon nitride film. The insulating film 20 has openings. The gate electrode 22 is formed on the electron supplying layer 18 in one of the openings. The gate electrode 22 is made, for example, of a Ni (nickel) film and an Au (gold) film in the sequence set forth from the substrate 10. The electron supplying layer 18 and the gate electrode 22 may be in contact with each other. A gate insulating film or the nitride-semiconductor cap layer may be formed between the electron supplying layer 18 and the gate electrode 22. The source electrode 24 and the drain electrode 26 are formed in some of the openings on the electron supplying layer 18, with the gate electrode 22 interposed therebetween The source electrode 24 and the drain electrode 26 are ohmic electrodes. The source electrode 24 and the drain electrode 26 are made, for example, of a Ti (titanium) film and an Al (aluminum) film in the sequence set forth from the substrate 10. The Ti film may be a Ta (tantalum) film. The electron supplying layer 18 may be in contact with the source electrode 24 and the drain electrode 26. The nitride-semiconductor cap layer may be formed between the electron supplying layer 18 and the source electrode 24 and between the electron supplying layer 18 and the drain electrode 26.

As described above, a double heterostructure of barrier layer 14/channel layer 16/electron supplying layer 18 is provided in the first embodiment.

Figure 7:
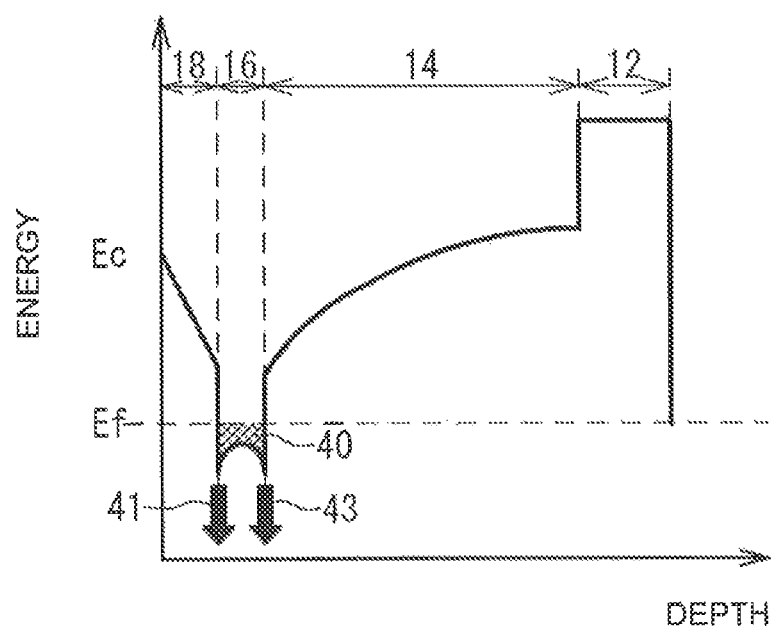
FIG. 7 is a graph of the energy with respect to the depth underneath a gate electrode of the semiconductor device according to the first embodiment.

FIG. 7 is a graph of the energy with respect to the depth underneath the gate electrode of the semiconductor device according to the first embodiment. As illustrated in FIG. 7, positive piezoelectric charges are generated at the interface between the channel layer 16 and the electron supplying layer 18, as in Comparative Example 1. The energy of the conduction band Ec is lowered accordingly, as marked with an arrow 41. Positive piezoelectric charges are also generated at the interface between the barrier layer 14 and the channel layer 16. This is because the length of the a-axis of the barrier layer 14 is shorter than the length of the a-axis of the channel layer 16. The conduction band Be at the interface between the barrier layer 14 and the channel layer 16 is lowered accordingly as marked with an arrow 43. In this way, the conduction band Ec at the channel layer 16 takes a substantially inverted U shape. Thus, the distortion characteristic is improved. The interface between the barrier layer 14 and the channel layer 16 and the interface between the channel layer 16 and the electron supplying layer 18 have conduction band energy lower than the Fermi level energy.

Figure 8:
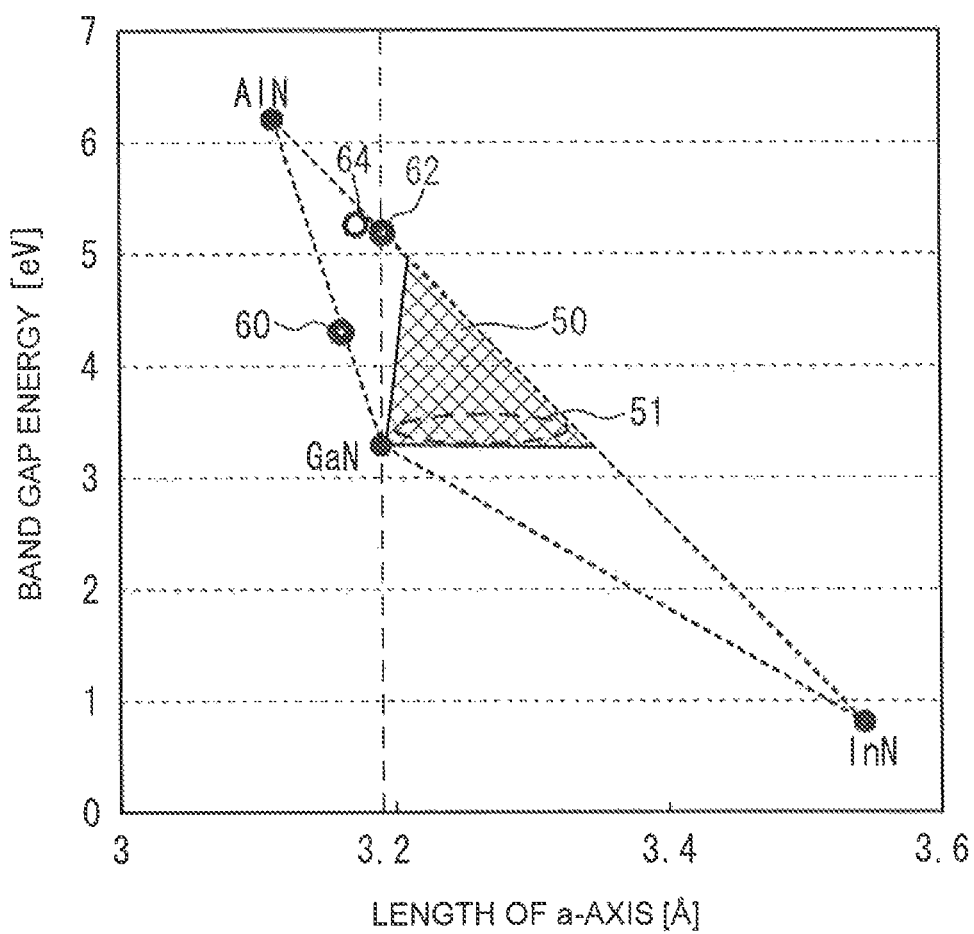
FIG. 8 is a graph of band gap energy with respect to the length of the a-axis in InAlGaN.

The composition of the barrier layer 14 will now be described. FIG. 8 is a graph of band gap energy with respect to the length of the a-axis (the lattice constant in the a-axis) in InAlGaN. As illustrated in FIG. 8, AlN has a shorter length of the the a-axis and larger band gap energy than GaN. InN has a longer length of the a-axis and smaller band gap energy than GaN. Thus, with the channel layer 16 of GaN and the electron supplying layer 18 of AlGaN, the band gap energy of the electron supplying layer 18 is larger than that of the channel layer 16. A white circle 60 represents an AlGaN material having 30% Al, which is commonly used as the electron supplying layer 18. In this case, the length of the a-axis of the electron supplying layer 18 is shorter than that of the channel layer 16. Hence, positive piezoelectric charges are generated at the interface between the channel layer 16 and the electron supplying layer 18, as in FIG. 7. Alternatively, the electron supplying layer 18 may be made of InAlN. A white circle 64 represents an MAIN material having 16% In, which is commonly used as the electron supplying layer 18. In this case, positive piezoelectric charges are also generated at the interface between the channel layer 16 and the electron supplying layer 18.

Depending on composition proportions, InAlGaN can have a longer length of the a-axis than GaN. For example, an InAlN material at a white circle 62 has an identical length of the a-axis with GaN. In this case, the proportion of In is 18%. In other words, when the proportion of In is less than 18%, negative piezoelectric charges are generated at the interface between the barrier layer 14 and the channel layer 16. In contrast, when the proportion of In is more than 18%, positive piezoelectric charges can be generated at the interface between the barrier layer 14 and the channel layer 16. More specifically, spontaneous polarization occurs at the interface between the barrier layer 14 and the channel layer 16. Thus, when the proportion of In is approximately 20% or more, piezoelectric polarization exceeds spontaneous polarization, so that positive piezoelectric charges are generated at the interface between the barrier layer 14 and the channel layer 16.

A case in which the barrier layer 14 is made of $In_xAl_yGa_{1-x-y}N$ will now be described. Here, relations between x and y for the barrier layer 14 are $x>0$, $y>0$, and $x+y-1$. Satisfying a relation of $x+y=1$ provides MAIN. A relation of $y<4.20x$ should be satisfied so that the piezoelectric polarization exceeds the spontaneous polarization and positive piezoelectric charges are generated at the interface between the barrier layer 14 and the channel layer 16. A relation of $y<3.0x$ is more preferable.

Additionally, to increase the band gap of the harrier layer 14 so as to be larger than that of the channel layer 16, a relation of $y>0.533x$ should be satisfied. A relation of $y>0.75x$ is more preferable. A relation of $0.533x<y<4.20x$ is satisfied in a crosshatched area 50 in FIG. 8.

Figure 9:
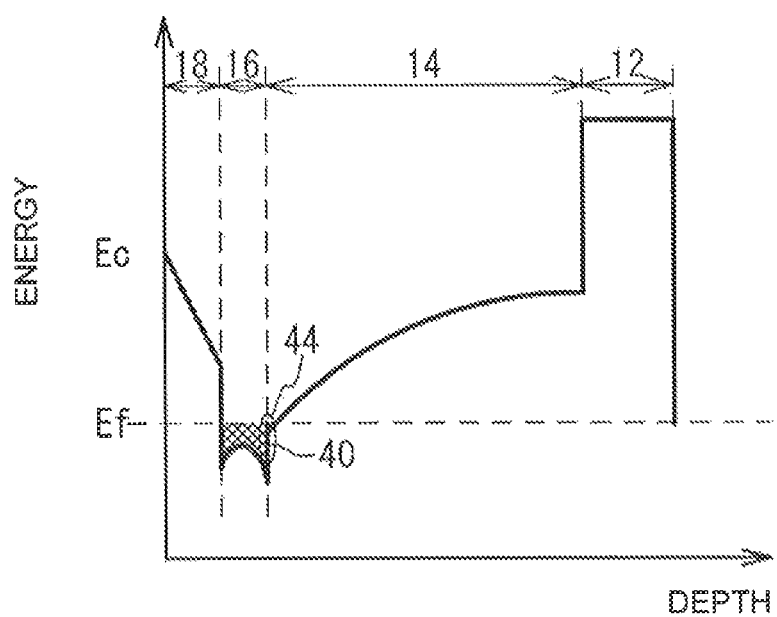
FIG. 9 is a graph of the energy with respect to the depth in an area 51 in FIG. 8.

FIG. 9 is a graph of the energy with respect to the depth in an area 51 illustrated in FIG. 8. As illustrated in FIG. 9, the difference in band gap energy between the barrier layer 14 and the channel layer 16 is not great in the area 51. This results in a reduction in discontinuous energy of the conduction band. Fc at the interface between the barrier layer 14 and the channel layer 16. This causes carriers in the channel layer 16 to flow into the barrier layer 14. The interface between the barrier layer 14 and the channel layer 16 and the interface between the channel layer 16 and the electron supplying layer 18 have conduction band energy lower than the Fermi level energy.

Figure 10:
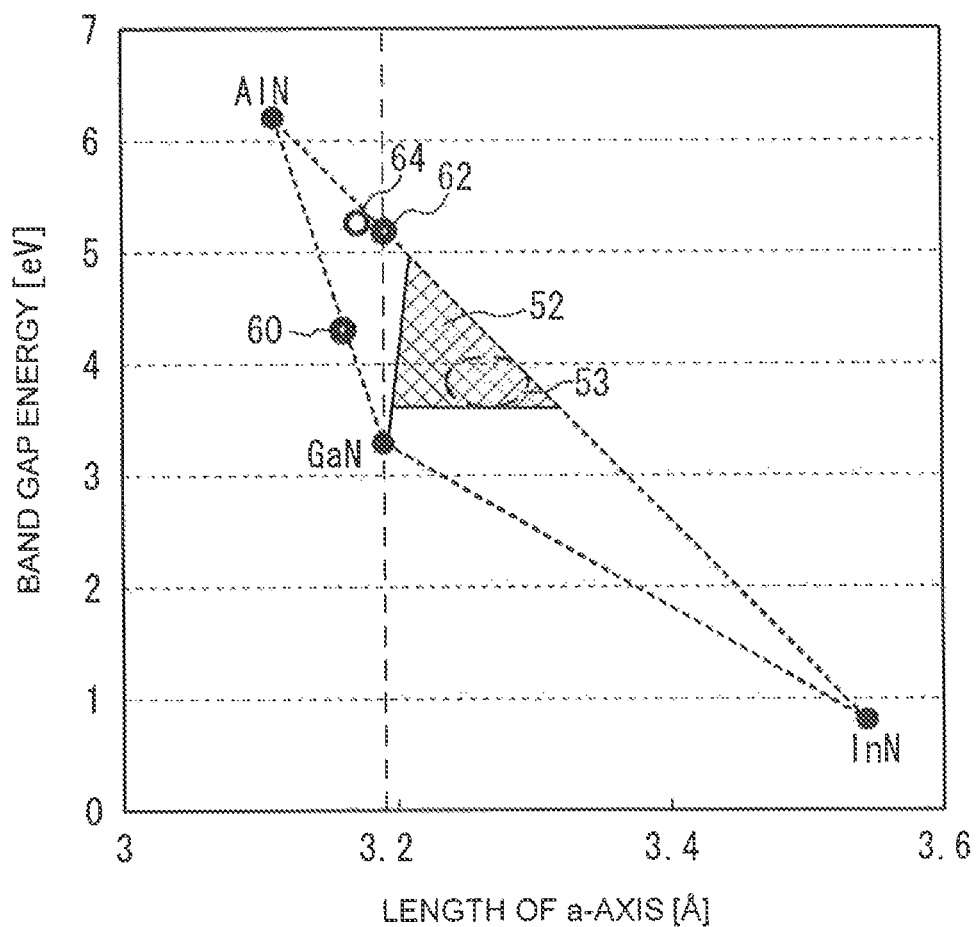
FIG. 10 is a graph of the band gap energy with respect to the length of the a-axis in InAlGaN.

FIG. 10 is a graph of the band gap energy with respect to the length of the a-axis. As illustrated in FIG. 10, the band gap energy of the barrier layer 14 is preferably higher than the band gap energy of the channel layer 16 by 0.2 eV or more in order to restrict leak current due to carriers in the channel layer 16 flowing into the barrier layer 14 when the temperature of the semiconductor device reaches approximately 200° C. The band gap energy of Gait is 3.4 eV. Thus, the band gap energy of the harrier layer 14 is preferably 3.6 eV or more. Through this, leak current due to carriers in the channel layer 16 flowing into the barrier layer 14 can be restricted. The band gap energy of the barrier layer 14 is more preferably 3.7 eV or more. The band gap energy of the barrier layer 14 is 3.6 eV or more in a crosshatched area 52 in FIG. 10, which is within the area 50.

Figure 11:
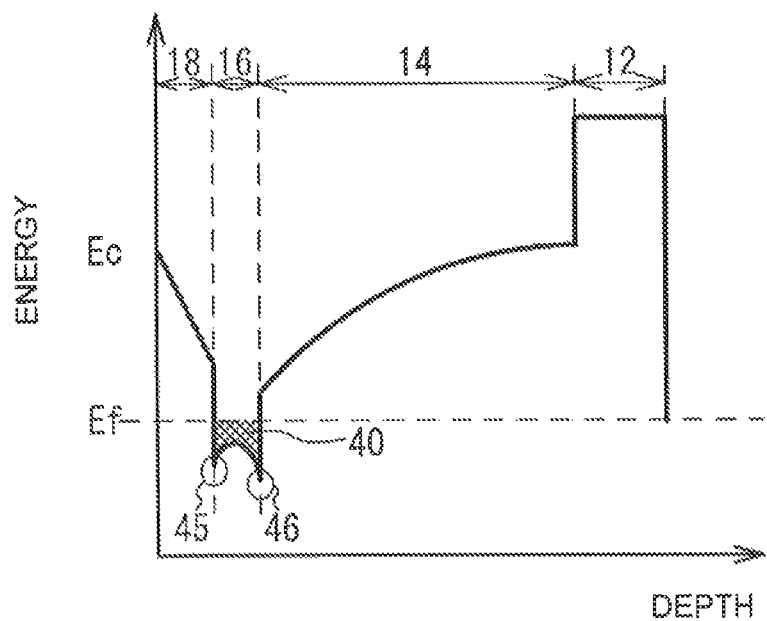
FIG. 11 is a graph of the energy with respect to the depth in an area 53 in FIG. 10.

FIG. 11 is a graph of the energy with respect to the depth in an area 53 in FIG. 10. As illustrated in FIG. 11, the difference in length of the a-axis between the barrier layer 14 and the channel layer 16 is larger than the difference in length of the a-axis between the channel layer 16 and the electron supplying layer 18 in the area 53. Hence, the concentration of two-dimensional electrons at an interface 46 between the barrier layer 14 and the channel layer 16 is higher than the concentration of two-dimensional electrons at an interface 45 between the channel layer 16 and the electron supplying layer 18. When the electron concentrations at the interfaces 45 and 46 lose balance as described above, the substantially inverted U shape of the conduction band Be in the channel layer 16 is asymmetrical, leading to degradation in the flatness of gm. Thus, the improvement in distortion characteristic is limited. The interface between the barrier layer 14 and the channel layer 16 and the interface between the channel layer 16 and the electron supplying layer 18 have conduction hand energy lower than the Fermi level energy.

Figure 12:
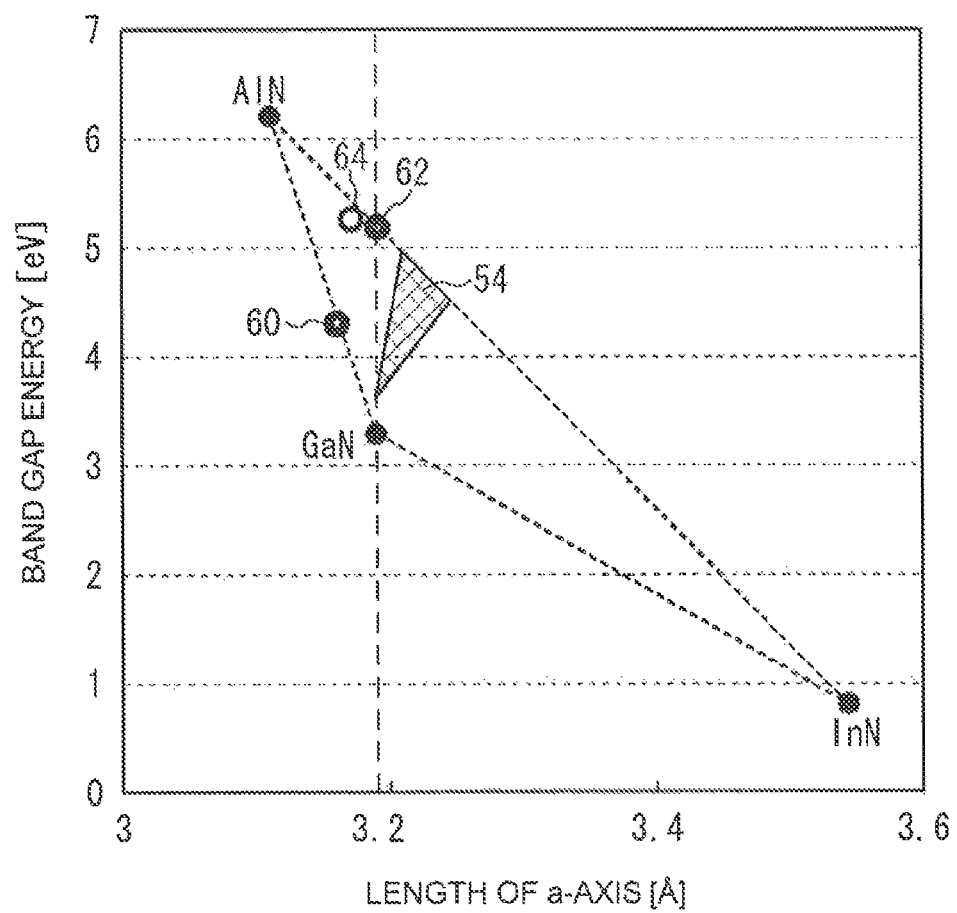
FIG. 12 is a graph of the band gap energy with respect to the length of the a-axis in InAlGaN.

FIG. 12 is a graph of the band gap energy with respect to the length of the a-axis. With the electron supplying layer 18 of AlGaN (a common proportion of Al being 30% or less) or of InAlN, the concentration of two-dimensional electrons generated at the interface between the channel layer 16 and the electron supplying layer 18 is approximately $5 \times 10^{12}$ to $1 \times 10^{13}$ cm$^{-3}$. Thus, it is preferable that the concentration of two-dimensional electrons at the interface between the barrier layer 14 and the channel layer 16 is also approximately $5 \times 10^{12}$ to $1 \times 10^{13}$ cm$^{-3}$. With a common expression for the concentration of two-dimensional electrons, a relation of $2.10x < y < 4.20x$ is preferably satisfied for the composition $In_xAl_yGa_{1-x-y}N$ of the barrier layer 14. A relation of $2.5x < y$ is more preferable. The relation of $2.10x < y < 4.20x$ is satisfied in a crosshatched area 54 in FIG. 12.

Figure 13:
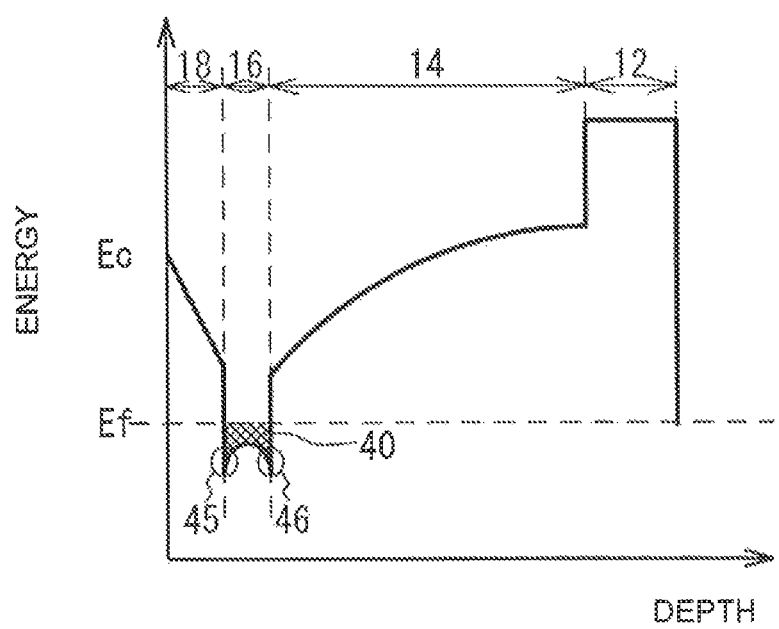
FIG. 13 is a graph of the energy with respect to the depth in an area 54 in FIG. 12.

FIG. 13 is a graph of the energy with respect to the depth in the area 54 in FIG. 12. As illustrated in FIG. 13, the concentration of two-dimensional electrons at the interface 46 is similar to that of two-dimensional electrons at the interface 45 in the area 54. This makes the substantially inverted U shape of the conduction band Fe in the channel layer 16 symmetrical, achieving the flatness of gm. Thus, the distortion characteristic is further improved. The interface between the barrier layer 14 and the channel layer 16 and the interface between the channel layer 16 and the electron supplying layer 18 have conduction band energy lower than the Fermi level energy.

The two-dimensional electron gases generated at the interface 46 and at the interface 45 serving as individual channels result in two peaks in gm, limiting the improvement in distortion characteristic. To cause the two-dimensional electron gases at the interfaces 46 and 45 to serve as one, the channel layer 16 preferably has a thickness of 100 nm or less, and more preferably a thickness of 80 nm or less. A small thickness of the channel layer 16 causes a leak of the two-dimensional electron gas into the barrier layer 14 and the electron supplying layer 18. Such a leak would lower the mobility in the channel layer 16 and thereby degrade the high frequency characteristic. Thus, the thickness of the channel layer 16 is preferably 20 nm or more, and more preferably 40 nm or more.

To improve the concentration of two-dimensional electrons generated at the interface between the channel layer 16 and the electron supplying layer 18, the electron supplying layer 18 of AlGaN preferably has 15-30% Al. The electron supplying layer 18 of InAlN preferably has 83-85% Al. The electron supplying layer 18 of InAlGaN preferably has 65-85% Al and 0-20% Ga.

Figure 14:
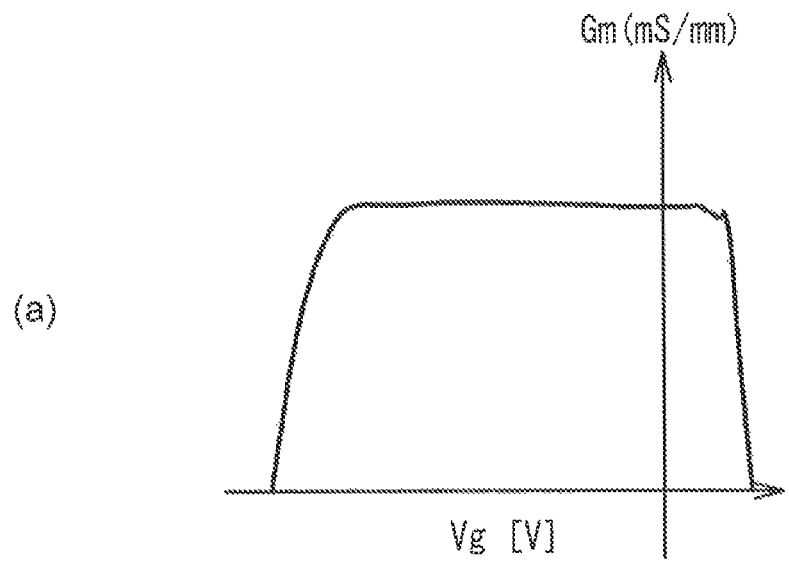
FIG. 14 includes (a) a diagrammatic representation of the transconductance gm with respect to the gate voltage Vg in the first embodiment and (b) a diagrammatic representation of the output power Pout and the intermodulation distortion IM3 with respect to the input power Pin in the first embodiment used as a high-power amplifier.
Figure 14:
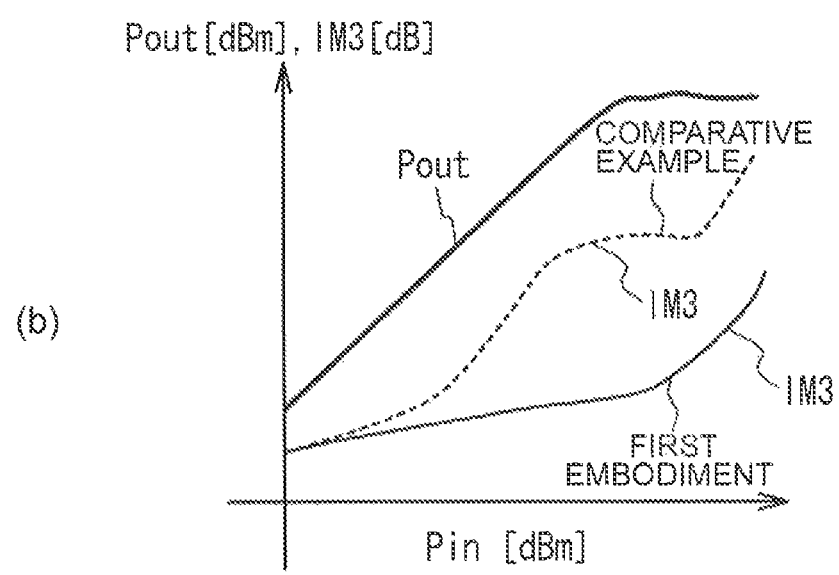

Part (a) of FIG. 14 is a diagrammatic representation of the transconductance gm with respect to the gate voltage Vg in the first embodiment, and Part (b) of FIG. 14 is a diagrammatic representation of the output power Pout and the intermodulation distortion IM3 with respect to the input power Pin in the first embodiment used as a high-power amplifier. Measuring conditions will be described hereinafter. As illustrated in Part (a) of FIG. 14, gin has a wide flat area with respect to Vg. As illustrated in Part (b) of FIG. 14, the input power Pin to output power Pout characteristic in the first embodiment is similar to that in Comparative Example 1. In contrast, the third order intermodulation distortion IM3 in the first embodiment is smaller than that of Comparative Example 1. As described above, the intermodulation distortion IM3 is small in the first embodiment, resulting in improvement in distortion characteristic.

The barrier layer 14 according to the first embodiment illustrated in FIG. 6 is a single layer with uniform composition. Note that the composition of the interface between the barrier layer 14 and the channel layer 16 is a primary cause of the changes in band structure due to piezoelectric charges described above. Thus, the interface between the barrier layer 14 and the channel layer 16 and its surroundings may have the composition corresponding to those represented by the area 50 of FIG. 8, the area 52 of FIG. 10, or the area 54 of FIG. 12.

Figure 15:
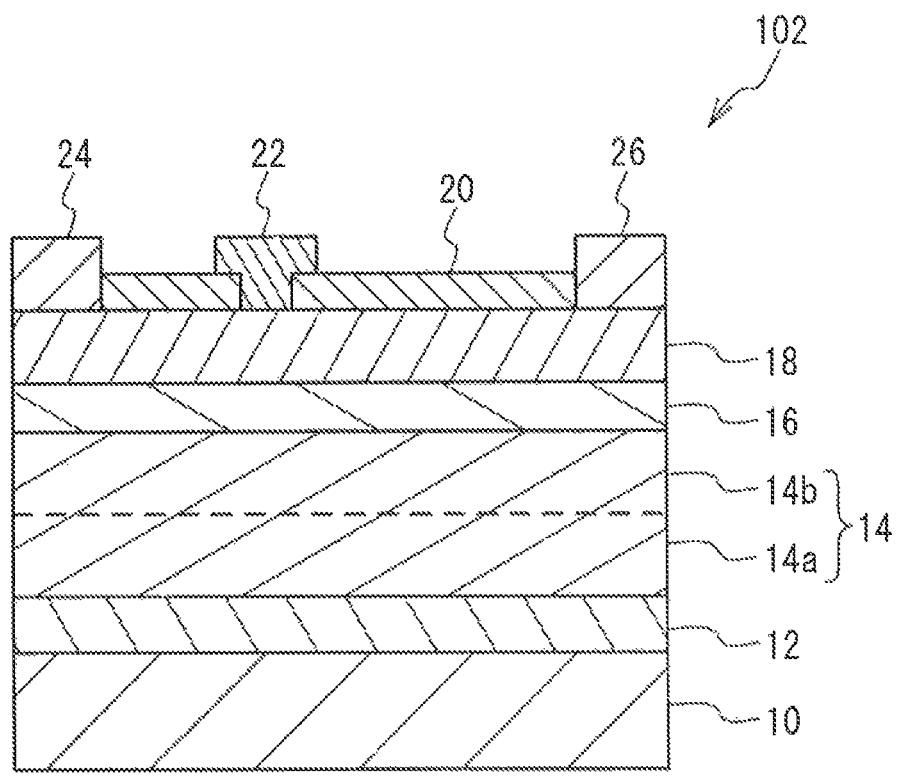
FIG. 15 is a sectional view of a semiconductor device according to a modification of the first embodiment.

FIG. 15 is a sectional view of a semiconductor device according to a modification of the first embodiment. As illustrated, in FIG. 15, a semiconductor device 102 includes a barrier layer 14 that includes a first layer 14a and a second layer 14b formed on the first layer 14a. The first layer 14a and the second layer 14b may be both made of InAlGaN. Alternatively, the first layer 14a may be made of AlGaN, and the second layer 14b may be made of InAlGaN. In general, the growth rate of InAlGaN is higher than that of AlGaN. Thus, the first layer 14a of AlGaN achieves improved mass productivity. The rest of the composition is identical with that in the first embodiment and thus its description is omitted.

Figure 16:
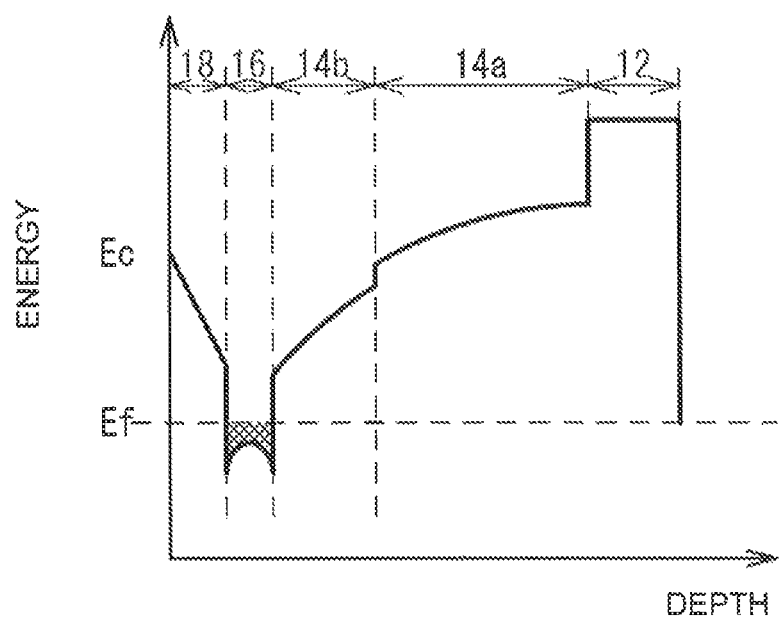
FIG. 16 is a graph of the energy with respect to the depth in the modification of the first embodiment.

FIG. 16 is a graph of the energy with respect to the depth in the modification of the first embodiment. The band gap energy of the first layer 14a is larger than that of the second layer 14b. The barrier layer 14 may include a plurality of layers with each layer having uniform composition, as in the modification of the first embodiment. The second layer 14b, which is part of the barrier layer 14 and in contact with the channel layer 16, may have composition corresponding to that represented by the area 50 in FIG. 8, the area 52 in FIG. 10, or the area 54 in FIG. 12. Alternatively, the barrier layer 14 may be compositionally graded. The interface between the barrier layer 14 and the channel layer 16 and the interface between the channel layer 16 and the electron supplying layer 18 have conduction band energy lower than the Fermi level energy.

Figure 17:
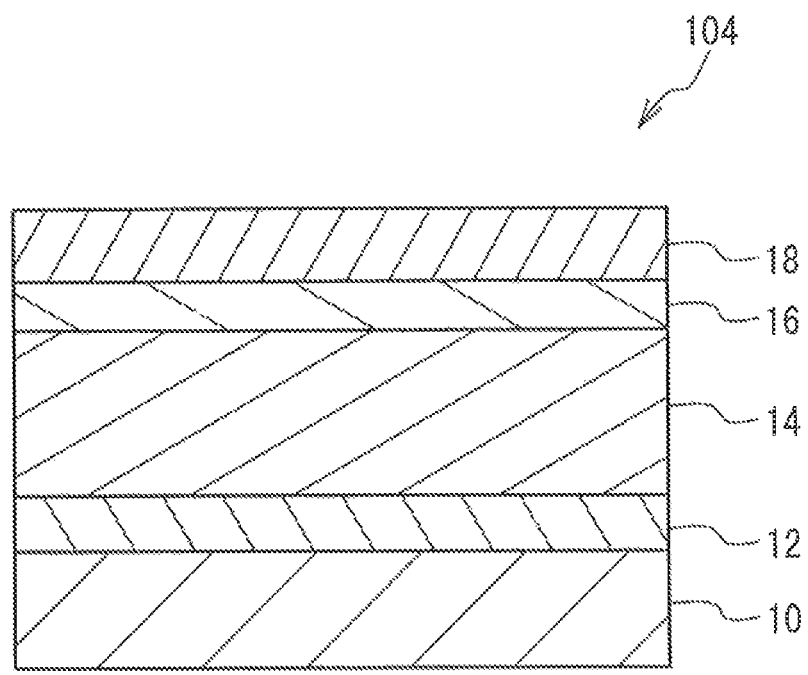
FIG. 17 is a sectional view of a semiconductor substrate.

A method of manufacturing the semiconductor device according to the first embodiment will now be described. In an early part of the process, a semiconductor substrate is formed. FIG. 17 is a sectional view of the semiconductor substrate. A method of manufacturing a semiconductor substrate 104 will now be described. A SiC substrate is used as the substrate 10 to grow thereon a buffer layer 12, a barrier layer 14, a channel layer 16, and an electron supplying layer 18 through metal organic chemical vapor deposition (MOCVD).

An AlN layer and a GaN layer on the AlN layer are grown as the buffer layer 12.
Growing Conditions for the AlN Layer
Composition: AlN
Thickness: 50 nm
Growing temperature: 1080° C.
Pressure: 113 kPa
Material: TMA (trimethylaluminum), $NH_3$ (ammonia)
   Growing Conditions for the GaN Layer
Composition: GaN
Thickness: 700 nm
Growing temperature: 1080° C.
Pressure: 113 kPa
Material: TMG (trimethylgallium), $NH_3$
Flow rate: 120 μmol/min (TMG), 0.5 mol/min ($NH_3$)
Growth rate: 0.4 nm/sec
   Growing conditions for the barrier layer 14
Composition: MAIN (with 20% In)
   Thickness: 400 nm
Growing temperature: 820° C.
Pressure: 1.13 kPa
Material: TMI (trimethylindium), TMA, $NH_3$
Flow rate: 60 μmol/min (TMI), 30 μmol/min (TMA), 0.5 mol/mm ($NH_3$)
Growth rate: 0.2 nm/sec
   Growing Conditions For The Channel Layer 16
Composition: GaN
Thickness: 100 nm
   Growing temperature: 1080° C.
Pressure: 113 kPa
Material: TMG (trimethylgallium), $NH_3$
Flow rate: 120 μmol/min (TMG), 0.5 mol/min
Growth rate: 0.4 nm/sec
   Growing Conditions for the Electron Supplying Layer 18
Composition: AlGaN (with 20% Al)
Thickness: 20 nm
Growing temperature: 1080° C.
Pressure: 13.3 kPa
Material: TMA, TMG, $NH_3$ The semiconductor substrate 104 is completed through the method described above. A Ti film and an Al film are formed on the semiconductor substrate 104 in the sequence set forth from the substrate as the source electrode 24 and the drain electrode 26. A Ni film and an Au film are formed on the semiconductor substrate 104 in the sequence set forth from the substrate as the gate electrode. A silicon nitride film is formed as the insulating film 20. The semiconductor device according to the first embodiment is completed through the method described above.

The semiconductor device according to the first embodiment is fabricated, with the gate length of 0.5 μm and the distance between the source electrode and the drain electrode at 5 μm.

The semiconductor device according to Comparative Example 1 is fabricated with the channel layer 30 having a thickness of 1200 nm. The other applicable conditions are identical with those for the first embodiment.

A Vgs-Ids characteristic is measured in the first embodiment and Comparative Example 1, with drain voltage at 10 V and the gate voltage varied from −5 V to 2 V. A gm characteristic is obtained from the Vgs-Ids characteristic. Part (a) of FIG. 3 is the diagrammatic representation of the gm characteristic in Comparative Example 1, and Part (a) of FIG. 14 is the diagrammatic representation of the gm characteristic in the first embodiment. Additionally, high-frequency measurement is conducted in the first embodiment and Comparative Example 1 to obtain the Pin-Pout characteristic and the Pin-IM3 characteristic. Part (b) of FIG. 3 is the diagrammatic representation of the high frequency characteristic in Comparative Example 1, and Part (b) of FIG. 14 is the diagrammatic representation of the high frequency characteristic in the first embodiment.

Figure 18:
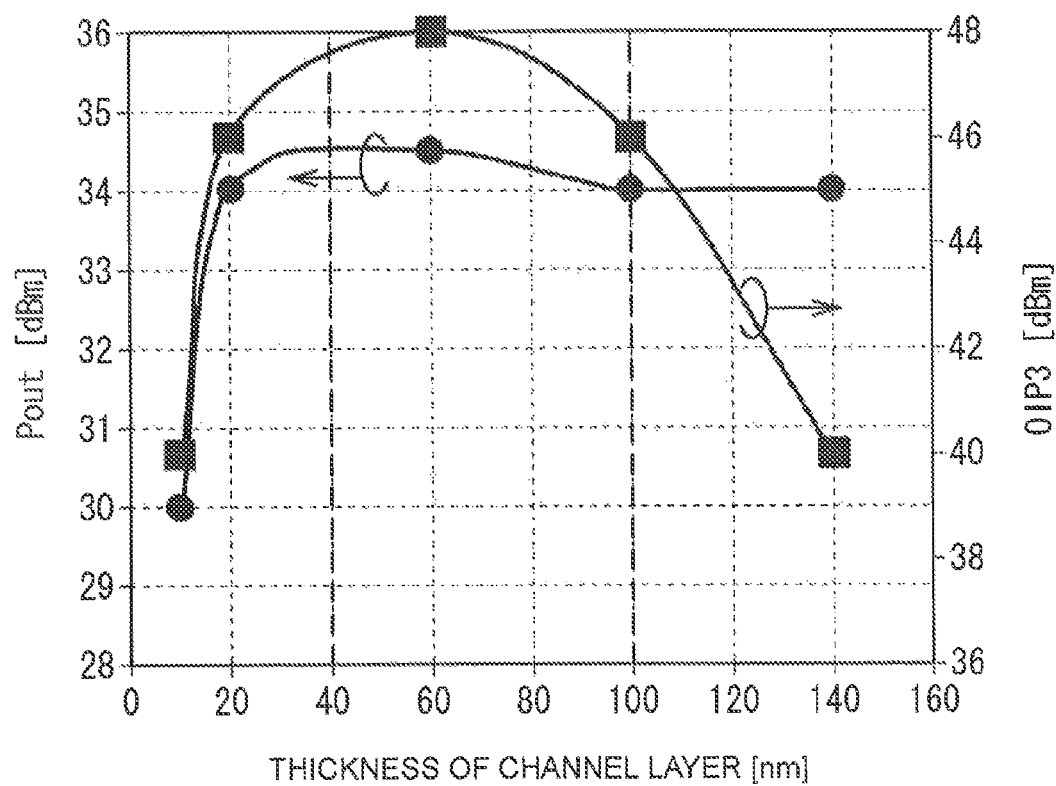
FIG. 18 is a graph of Pout and OIP3 with respect to the thickness of a channel layer.

Furthermore, with the thickness of the channel layer 16 in the first embodiment varied from 10 nm to 140 nm, Pout and OIP3 are measured. FIG. 18 is a graph of Pout and OIP3 with respect to the thickness of the channel layer. Dots represent measurement points, with approximate lines. As illustrated in FIG. 18, Pout and OIP3 are large when the thickness of the channel layer 16 is not less than 20 nm and not more than 100 nm.

Although the invention has been described in detail based on the embodiments, the invention is not limited to these specific embodiments, and various modifications and changes are possible within the spirit of the invention as described in the claims.

What is claimed is:

1. A semiconductor device, comprising:
a barrier layer formed on a substrate and made of one of InAlGaN and InAlN;
a channel layer formed on the barrier layer and made of one of GaN and InGaN;
an electron supplying layer formed on the channel layer and made of one of AlGaN, InAlN, and InAlGaN; and
a gate electrode and ohmic electrodes formed on the electron supplying layer,
wherein an interface between the barrier layer and the channel layer and an interface between the channel layer and the electron supplying layer have a conduction band energy lower than the Fermi level energy, whereby the conduction band at the channel layer forms an inverted U shape; and
wherein the channel layer has a thickness of not less than 20 nm and not more than 100 nm.

2. The semiconductor device according to claim 1, wherein the barrier layer is a single layer having uniform composition.

3. The semiconductor device according to claim 1, wherein the barrier layer includes a plurality of layers, each layer having uniform composition.

4. A semiconductor device, comprising:
a barrier layer formed on a substrate, the barrier layer being a single layer having a uniform composition of $In_xAl_yGa_{1-x-y}N$;
a channel layer formed on the barrier layer and made of one of GaN and InGaN;
an electron supplying layer formed on the channel layer and made of one of AlGaN, InAlN, and InAlGaN; and
a gate electrode and ohmic electrodes formed on the electron supplying layer,
wherein relations between x and y for the barrier layer of $x>0$, $y>0$, $x+y \leq 1$, and $0.533x < y < 4.20x$ are satisfied.

5. The semiconductor device according to claim 4, wherein the barrier layer has a band gap of not less than 3.6 eV.

6. The semiconductor device according to claim 4, wherein a relation of $2.10x < y$ is satisfied.

7. The semiconductor device according to claim 4, wherein the channel layer has a thickness of not less than 20 nm and not more than 100 nm.

8. The semiconductor device according to claim 4, wherein in a case in which the electron supplying layer is made of InAlN, the electron supplying layer has less than 18% In.

9. The semiconductor device according to claim 4, wherein the barrier layer is a single layer having uniform composition.

10. The semiconductor device according to claim 4, wherein the barrier layer includes a plurality of layers, each layer having uniform composition.

11. The semiconductor device according to claim 4, wherein, in a case in which the electron supplying layer is made of AlGaN, the electron supplying layer has 15-30% Al, in a case in which the electron supplying layer is made of InAlN, the electron supplying layer has 83-85% Al, and in a case in which the electron supplying layer is made of InAlGaN, the electron supplying layer has 65-85% Al and 0-20% Ga.

12. A semiconductor substrate, comprising:
a barrier layer formed on a substrate, the barrier layer being a single layer having a uniform composition of $In_xAl_yGa_{1-x-y}N$;
a channel layer formed on the barrier layer and made of one of GaN and InGaN; and
an electron supplying layer formed on the channel layer and made of one of AlGaN, InAlN, and InAlGaN,
wherein relations between x and y for the barrier layer of $x>0$, $y>0$, $x+y \leq 1$, and $0.533x<y<4.20x$ are satisfied.

13. The semiconductor substrate according to claim 12, wherein the barrier layer has a band gap of not less than 3.6 eV.

14. The semiconductor substrate according to claim 12, wherein a relation of $2.10\ x<y$ is satisfied.

15. The semiconductor substrate according to claim 12, wherein the channel layer has a thickness of not less than 20 nm and not more than 100 nm.

16. The semiconductor substrate according to claim 12, wherein in a case in which the electron supplying layer is made of InAlN, the electron supplying layer has less than 18% In.

17. The semiconductor substrate according to claim 12, wherein, in a case in which the electron supplying layer is made of AlGaN, the electron supplying layer has 15-30% Al, in a case in which the electron supplying layer is made of InAlN, the electron supplying layer has 83-85% Al, and in a case in which the electron supplying layer is made of InAlGaN, the electron supplying layer has 65-85% Al and 0-20% Ga.

* * * * *